United States Patent
Lai et al.

(10) Patent No.: US 10,628,639 B1
(45) Date of Patent: Apr. 21, 2020

(54) METHOD OF CABLE SENSING DATA COLLECTION, AND ELECTRONIC APPARATUS AND CHIP USING THE SAME

(71) Applicant: Chung Yuan Christian University, Taoyuan (TW)

(72) Inventors: Yu-Kuen Lai, Taoyuan (TW); Tzu-Hang Lin, Hsinchu County (TW); Chung-Hsiang Cheng, New Taipei (TW); Ku-Yeh Shih, Changhua County (TW)

(73) Assignee: Chung Yuan Christian University, Taoyuan (TW)

(*) Notice: Subject to any disclaimer, the term of this patent is extended or adjusted under 35 U.S.C. 154(b) by 0 days.

(21) Appl. No.: 16/208,568

(22) Filed: Dec. 4, 2018

(30) Foreign Application Priority Data

Nov. 26, 2018 (TW) .............................. 107142118 A

(51) Int. Cl.
| | |
|---|---|
| *G01R 31/02* | (2006.01) |
| *H04B 3/46* | (2015.01) |
| *G06K 7/00* | (2006.01) |
| *G06K 7/10* | (2006.01) |
| *G01R 31/58* | (2020.01) |
| *G01R 31/50* | (2020.01) |
| *G01R 31/12* | (2020.01) |
| *G01R 31/11* | (2006.01) |
| *G01R 31/00* | (2006.01) |

(52) U.S. Cl.
CPC .......... *G06K 7/0095* (2013.01); *G01R 31/008* (2013.01); *G01R 31/11* (2013.01); *G01R 31/1272* (2013.01); *G01R 31/50* (2020.01); *G01R 31/58* (2020.01); *G06K 7/10366* (2013.01); *H01L 2924/00* (2013.01); *H01L 2924/0002* (2013.01); *H01L 2924/00014* (2013.01)

(58) Field of Classification Search
CPC .... G01R 31/58; G01R 31/50; G01R 31/1272; G01R 31/11; G01R 31/008; H01L 2924/00; H01L 2924/00014; H01L 2924/0002
USPC ................. 324/71, 378, 403, 415, 425, 500, 324/513–518, 537, 543
See application file for complete search history.

(56) References Cited

U.S. PATENT DOCUMENTS

| | | | |
|---|---|---|---|
| 2011/0131375 A1* | 6/2011 | Noeldner | G06F 12/00 711/114 |
| 2016/0011996 A1* | 1/2016 | Asaad | G06F 15/76 710/308 |
| 2019/0182049 A1* | 6/2019 | Juels | H04L 9/3239 |

\* cited by examiner

*Primary Examiner* — Raul J Rios Russo
(74) *Attorney, Agent, or Firm* — JCIPRNET

(57) ABSTRACT

A method of cable sensing data collection applicable to an electronic apparatus having a counter array is provided. The electronic apparatus is for detecting a cable including a plurality of sensors and a plurality of RFID tags, where each of the RFID tags is used to receive cable sensing data of the cable obtained by the sensors. The method includes: scanning each of the RFID tags to retrieve the cable sensing data, where the cable sensing data includes a tag identifier of the RFID tag; converting the tag identifier to a plurality of array addresses through a plurality of hash functions; and transmitting the cable sensing data to a cloud platform according to whether a plurality of elements of the array addresses in the counter array having a zero or not. In addition, an electronic and a chip using the method are also provided.

10 Claims, 3 Drawing Sheets

| | A[0] | A[1] | A[2] | A[3] | A[4] | A[5] | A[6] | A[7] | A[8] | A[9] | |
|---|---|---|---|---|---|---|---|---|---|---|---|
| | 0 | 0 | 0 | 0 | 0 | 0 | 0 | 0 | 0 | 0 | — 501 |

| | A[0] | A[1] | A[2] | A[3] | A[4] | A[5] | A[6] | A[7] | A[8] | A[9] | |
|---|---|---|---|---|---|---|---|---|---|---|---|
| | 0 | 1 | 1 | 0 | 1 | 1 | 0 | 2 | 0 | 0 | — 502 |

FIG. 5

| | A[0] | A[1] | A[2] | A[3] | A[4] | A[5] | A[6] | A[7] | A[8] | A[9] | |
|---|---|---|---|---|---|---|---|---|---|---|---|
| | 0 | 1 | 1 | 0 | 1 | 1 | 0 | 2 | 0 | 0 | — 601 |

| | A[0] | A[1] | A[2] | A[3] | A[4] | A[5] | A[6] | A[7] | A[8] | A[9] | |
|---|---|---|---|---|---|---|---|---|---|---|---|
| | 0 | 0 | 1 | 0 | 0 | 1 | 0 | 1 | 0 | 0 | — 602 |

FIG. 6

METHOD OF CABLE SENSING DATA COLLECTION, AND ELECTRONIC APPARATUS AND CHIP USING THE SAME

CROSS-REFERENCE TO RELATED APPLICATION

This application claims the priority benefit of Taiwan application serial no. 107142118, filed on Nov. 26, 2018. The entirety of the above-mentioned patent application is hereby incorporated by reference herein and made a part of this specification.

FIELD OF THE INVENTION

The invention relates to a technique of sensing data collection and more particularly, to a method of cable sensing data collection and an electronic apparatus and a chip using the same.

DESCRIPTION OF RELATED ART

Wires and cables are in charge of power and data transmission for communication purposes (for example, networking), transportation purposes (for example, electrified railways) or the use in mobile machinery (for example, port cargo handling machinery equipment) and thus, play an indispensable role in people's livelihood, light industry and heavy industry. Because infrastructural systems must operate continuously without interruption, working efficiency may be directly impacted to incur losses if malfunctions occur to the wire or cable instruments and result in an operational shutdown. In order to know the healthy conditions of the cable operations, currently, the cables are detected commonly by using the partial discharge method. However, in the operation of the partial discharge method, the detection cannot be performed on the cables unless machines are powered off. The interruption of transmission of power and communication may cause inconvenience. Alternatively, the cables may be detected by a distributed optical fiber temperature sensing technology, however, optical fiber temperature sensing device used by such method are much cost-expensive.

In comparison with the method where the machines must be powered off or the method which is costly, to avoid the loss caused by the cable breakdown causing the shutdown of the facility, a real-time sensing system which contains intelligent cable can be used to detect the cable condition. In this system, the cables are embedded with a plurality of radio frequency identification (RFID) tags, and the RFID tags are read by a reader to obtain cable information. However, within a range capable of being read by the reader, when the cables move toward one side, the reader may read the cable information in the same RFID tags repeatedly in a short time with high probability and transmit the repeated information. The unnecessarily repeated information occupies store spaces (buffers) for IoT (Internet of things) devices.

SUMMARY

Accordingly, the disclosure provides a method of cable sensing data collection, and an electronic apparatus and a chip using the method capable of reducing unnecessary data transmission.

An embodiment of the invention provides a method of cable sensing data collection applicable to an electronic apparatus having a counter array. The electronic apparatus is configured to detect a cable. The cable includes a plurality of sensors and a plurality of RFID tags, wherein each of the RFID tags is configured to receive cable sensing data of the cable obtained by the sensors. The method includes the following steps. Each of the RFID tags is scanned to retrieve the cable sensing data which contains a tag identifier of the RFID tag. The tag identifier is converted into a plurality of array addresses through a plurality of hash functions. Whether to transmit the cable sensing data to a remote host is determined according to whether or not a plurality of elements of the plurality of array addresses in the counter array include zero. When the cable shifts in a first shift direction, the cable sensing data is transmitted to the remote host, and the plurality of elements are incremented by one if the plurality of elements include zero, and the cable sensing data is not transmitted to the remote host if the plurality of elements do not include zero.

In an embodiment of the invention, in the method as described above, the step of determining whether to transmit the cable sensing data to the remote host according to whether or not the plurality of elements of the plurality of array addresses in the counter array comprise zero further includes the following steps. When the cable shifts in a second shift direction, the cable sensing data is transmitted to the remote host, and the plurality of elements are decremented by one if the plurality of elements do not include zero, and the cable sensing data is not transmitted to the remote host if the value of zero exists in the plurality of elements.

In an embodiment of the invention, the first shift direction and the second shift direction are reverse directions.

An embodiment of the invention provides an electronic apparatus configured to detect a cable. The cable includes a plurality of sensors and a plurality of RFID tags, where each of the RFID tags is configured to receive cable sensing data of the cable obtained by the sensors. The electronic apparatus includes a reader, a data transmitting device and a chip. The reader is configured to scan each of the RFID tags to retrieve the cable sensing data, wherein the cable sensing data includes a tag identifier of the RFID tag. The data transmitting device is configured to transmit the cable sensing data to a remote host. The chip is coupled to the reader and the data transmitting device and includes a counter array. The chip is configured to convert the tag identifier into a plurality of array addresses through a plurality of hash functions and determine whether to transmit the cable sensing data to the remote host according to whether or not a plurality of elements of the plurality of array addresses in the counter array include zero. When the cable shifts in a first shift direction, the chip is configured to control the data transmitting device to transmit the cable sensing data to the remote host and increment the plurality of elements by one if the plurality of elements include zero, and control the data transmitting device not to transmit the cable sensing data to the remote host if the plurality of elements do not include zero.

In an embodiment of the invention, the chip is configured to, when the cable shifts in a second shift direction, control the data transmitting device to transmit the cable sensing data to the remote host and decrement the plurality of elements by one if the plurality of elements do not include zero, and control the data transmitting device not to transmit the cable sensing data to the remote host if the plurality of elements include zero.

In an embodiment of the invention, the first shift direction and the second shift direction are reverse directions.

According to another viewpoint, an embodiment of the invention provides a chip applicable to an electronic apparatus configured to detect a cable, the cable includes a plurality of sensors and a plurality of RFID tags, wherein each of the RFID tags includes a tag identifier. The chip includes a hash function module, a counter array, a register and a controller. The hash function module includes a plurality of hash functions. The hash function module is configured to retrieve the tag identifier and convert the tag identifier into a plurality of array addresses through the plurality of hash functions. The counter array is coupled to the hash function module. The counter array is configured to receive the plurality of array addresses. The register is configured to receive and temporarily store the tag identifier. The controller is coupled to the hash function module, the counter array and the register. The controller is configured to receive a shift direction signal of the cable and determine whether to transmit a tag identifier valid signal corresponding to the tag identifier according to whether or not a plurality of elements of the plurality of array addresses in the counter array include zero. When the shift direction signal indicates a first shift direction, the controller is configured to transmit the tag identifier valid signal to a data transmitting device and increment the plurality of elements by one if the plurality of elements include zero, and not transmit the tag identifier valid signal to the data transmitting device if the plurality of elements do not include zero.

In an embodiment of the invention, the controller is further configured to, when the shift direction signal indicates in a second shift direction, transmit the tag identifier valid signal to the data transmitting device and decrement the plurality of elements by one if the plurality of elements do not include zero, and not transmit the tag identifier valid signal to the data transmitting device if the plurality of elements include zero.

In an embodiment of the invention, the first shift direction and the second shift direction are reverse directions.

In an embodiment of the invention, the controller is configured to, while transmitting the tag identifier valid signal to the data transmitting device, control the register to transmit the tag identifier corresponding to the tag identifier valid signal to the data transmitting device.

In order to make the aforementioned and other features and advantages of the invention more comprehensible, several embodiments accompanied with figures are described in detail below.

BRIEF DESCRIPTION OF THE DRAWINGS

FIG. 5 and FIG. 6 illustrate examples of the counter array according to embodiments of the invention.

DESCRIPTION OF EMBODIMENTS

In a method of cable sensing data collection according to the embodiments of the invention, a tag identifier contained in cable sensing data is converted through a plurality of hash functions to determine whether to transmit the cable sensing data to a remote host according to the converted tag identifier corresponding to values of array addresses in a counter array. When a reader scans radio frequency identification (RFID) tags of shifting cables, a chip in an electronic apparatus may determine not to transmit the repeated cable sensing data to the remote host when the repeated cable sensing data is read within a range capable of being read by the reader in a short time. Thereby, it is possible to rapidly filter out a great amount of repeated measured data, so as to reduce the data amount transmitted between the electronic apparatus and the remote host.

Part of the embodiments of the invention will be described in detail below with reference to the accompanying drawings. Regarding the element symbols used below, the same element symbols appearing in different drawings are deemed as referring to same or similar elements. Theses embodiments represent only parts of the invention, instead of representing all the manners that can be embodied by the invention. To be more specific, these embodiments are only examples of the method, the electronic apparatus and the chip recited in the claims of the invention.

Figure 1:
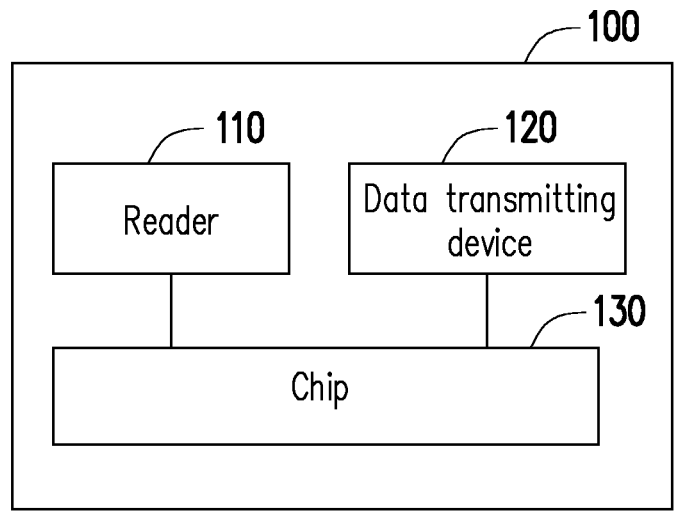
FIG. 1 is a block diagram illustrating an electronic apparatus according to an embodiment of the invention.

FIG. 1 is a block diagram illustrating an electronic apparatus according to an embodiment of the invention. Referring to FIG. 1, an electronic apparatus 100 includes a reader 110, a data transmitting device 120 and a chip 130. The electronic apparatus 100 may be any apparatus with computation capability callable of collecting data and transmitting the data to a remote host, for example, a personal computer (PC), a work station, a server, a notebook (NB) computer, a personal digital assistant (PDA), a smart phone or a tablet PC, which is not limited by the disclosure. The remote host is, for example, a cloud platform. In the present embodiment, the electronic apparatus 100 is capable of executing a program code implemented in a software or a firmware form, there by performing a method of cable sensing data collection of the invention.

In the present embodiment, the reader 110 is, for example, a radio frequency identification (RFID) reader. The reader 110 reads RFID tags on a cable to receive cable sensing data. In different embodiments, the data transmitting device 120 may be any device capable of transmitting data to the remote host in a wired or a wireless manner, for example, wireless fidelity (Wi-Fi) system, Worldwide Interoperability for Microwave Access (WiMAX) system, third-generation (3G) wireless communication technology, fourth-generation (4G) wireless communication technology, fifth-generation (5G) wireless communication technology, Long Term Evolution (LTE), infrared (IR) transmission, Bluetooth (BT) communication technology or combination of the above, which is not limited by the disclosure.

The chip 130 is coupled to the reader 110 and the data transmitting device 120. The chip 130 is applied in a method of cable sensing data collection according to an embodiment of the invention and is configured to determine whether to transmit the cable sensing data to the remote host.

Figure 2:
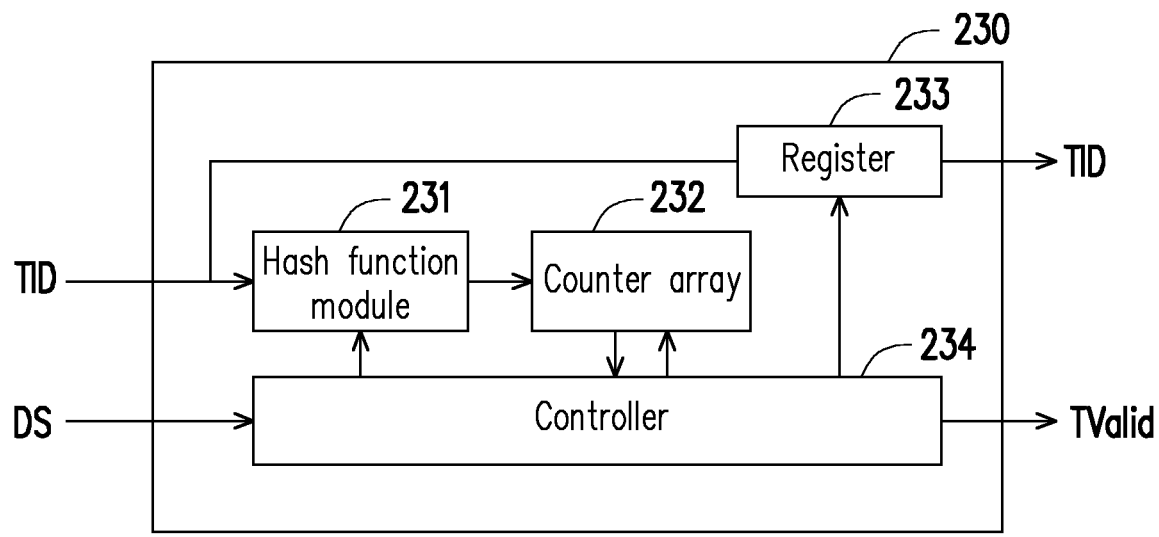
FIG. 2 is a block diagram illustrating a chip according to an embodiment of the invention.

FIG. 2 is a block diagram illustrating a chip according to an embodiment of the invention. A chip 230 includes a hash function module 231, a counter array 232, a register 233 and a controller 234. The hash function module 231 includes a plurality of hash circuits, and each of the hash circuits may execute a hash operation based on a preset hash function. The counter array 232 is coupled to the hash function module 231 and receives values calculated by the hash function module 231. The counter array 232 is, for example, a 4-bit counter array. The register 233 receives and temporarily stores a tag identifier received by the chip 230. The controller 234 is coupled to the hash function module 231, the counter array 232 and the register 233 and controls the aforementioned circuits.

Figure 3:
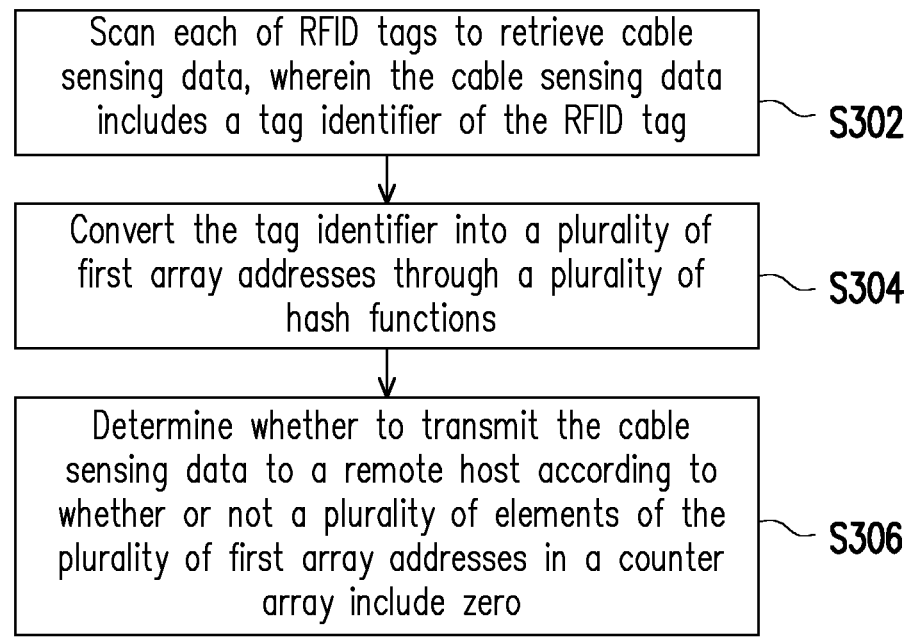
FIG. 3 is a flowchart illustrating cable sensing data collection according to an embodiment of the invention.

FIG. 3 is a flowchart illustrating cable sensing data collection according to an embodiment of the invention. Referring to FIG. 1 and FIG. 3 at the same time, the method of the present embodiment is applicable to the electronic apparatus 100 described above, and detailed steps of the method of cable sensing data collection will be described in collaboration with each device and element of the electronic apparatus 100 below.

First, the reader 110 scans each of RFID tags to retrieve cable sensing data, wherein the cable sensing data includes a tag identifier of the RFID tag (step S302). Then, the chip 130 converts the tag identifier into a plurality of first array addresses through a plurality of hash functions (step S304).

Finally, the chip 130 determines whether to transmit the cable sensing data to a remote host according to whether or not a plurality of elements of the plurality of first array addresses in a counter array include zero (step S306). When the cable shifts in a first shift direction, if the plurality of elements include zero, the data transmitting device 120 transmits the cable sensing data to the remote host, and the plurality of elements are incremented by one. If the plurality of elements do not include zero, the data transmitting device 120 does not transmit the cable sensing data to the remote host. On the other hand, when the cable shifts in a second shift direction, if the plurality of elements do not include zero, the data transmitting device 120 transmits the cable sensing data to the remote host, and the plurality of elements are decremented by one. If the plurality of elements include zero, the data transmitting device 120 does not transmit the cable sensing data to the remote host. In an embodiment, the first shift direction and the second shift direction are reverse directions.

Figure 4:
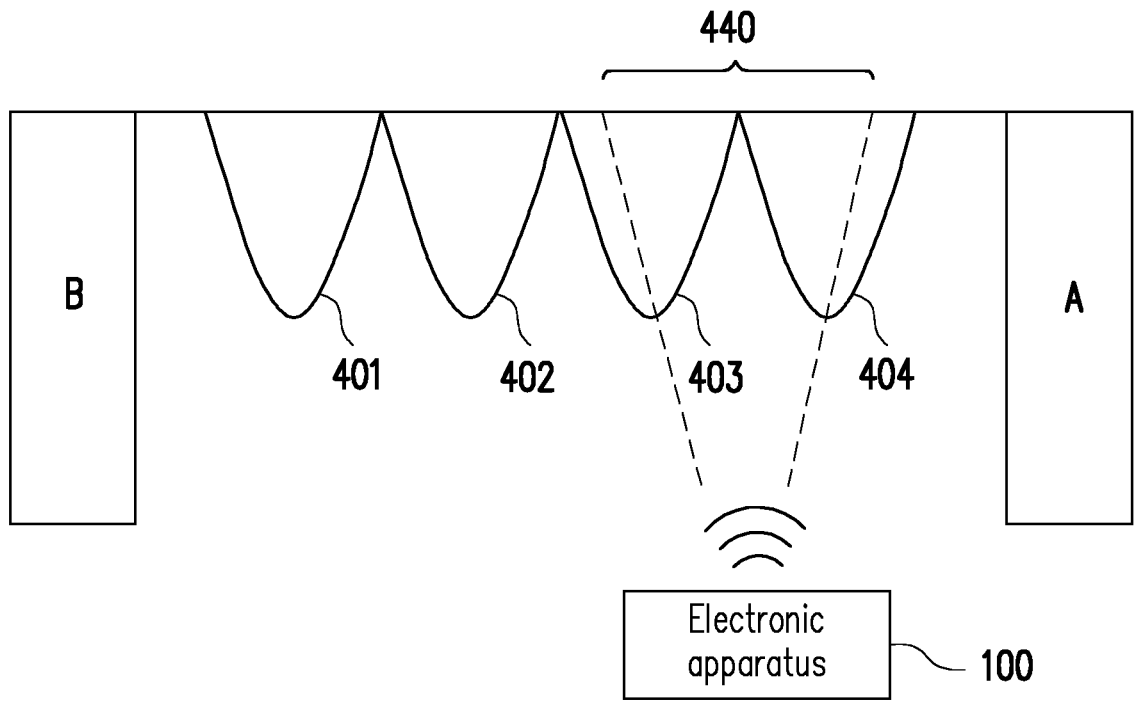
FIG. 4 is a schematic illustrating data collection of moving cables according to an embodiment of the invention.

For example, FIG. 4 is a schematic illustrating data collection of moving cables according to an embodiment of the invention. Referring to FIG. 4, a plurality of cables 401 to 404 are detected by using the electronic apparatus 100 illustrated in FIG. 1 in an embodiment of the invention. Each of the cables 401 to 404 contains a plurality of sensors and a plurality of RFID tags. Each of the RFID tags may be connected with the sensors and is configured to receive cable sensing data of the cables 401 to 404 obtained by sensors. The sensors may be those sensing the cable sensing data, for example, including temperatures, currents, voltages and so on, of the cables.

The cables 401 to 404 may be disposed in mechanical instruments moving in different directions. In the present embodiment, detection on the cables 401 to 404 hung on a port cargo handling machinery equipment moving right and left on a port is taken as an example to describe a method of cable sensing data collection provided according to an embodiment of the invention. The method of the present embodiment is applicable to the electronic apparatus 100 illustrated in FIG. 1 and the chip 230 illustrated in FIG. 2 described above, and detailed steps of the method of cable sensing data collection of the present embodiment will be described in collaboration with each device and element of the electronic apparatus 100 and the chip 230 below.

To be detailed, the electronic apparatus 100 scans the RFID tags of the cables 401 to 404 via the reader 110 to retrieve the cable sensing data. The cable sensing data includes a tag identifier TID of each of the RFID tags. In this circumstance, the reader 110 may input the tag identifier TID into the hash function module 231 and the register 233. In the meantime, the controller 234 receives a shift direction signal DS of each of the cables 401 to 404. In the present embodiment, it is assumed that the cables 401 to 404 shift in a first shift direction DS1 from a side A to a side B of the port cargo handling machinery equipment and shift in a second shift direction DS2 from the side B to the side A of the port cargo handling machinery equipment. In an embodiment, the first shift direction DS1 and the second shift direction DS2 are reverse directions, but the disclosure is not limited thereto.

Then, the hash function module 231 converts the tag identifier TID into a plurality of first array addresses through a plurality of hash functions. For example, taking three hash functions h0(x), h1(x) and h2(x) as an example, after the tag identifier TID is converted through the hash functions h0(x), h1(x) and h2(x), first array addresses $h_0$, $h_1$ and $h_2$ may be respectively generated. The first array addresses $h_0$, $h_1$ and $h_2$ may correspond to the array addresses in the counter array 232. The number of the hash functions may be less or more than three, which is not limited by the disclosure.

After the hash function module 231 converts the tag identifier TID into the first array addresses $h_0$, $h_1$ and $h_2$, the hash function module 231 inputs the first array addresses $h_0$, $h_1$ and $h_2$ into the counter array 232. The counter array 232 receives the first array addresses $h_0$, $h_1$ and $h_2$, and the controller 234 determines whether to transmit a tag identifier valid signal TValid corresponding to the tag identifier TID to the data transmitting device 120 according to whether or not value of zero exists in the values of a plurality of elements of the first array addresses $h_0$, $h_1$ and $h_2$ in the counter array 232.

FIG. 5 and FIG. 6 illustrate examples of the counter array according to embodiments of the invention. Referring to FIG. 4 simultaneously, in an embodiment, a reading range 440 of the electronic apparatus illustrated in FIG. 4 refers to a range capable of being scanned by the electronic apparatus 100. The reader 110 sequentially reads three tag identifiers TID_1, TID_2 and TID_1 from the cables 403 and 404, and the hash function module 231 receives the tag identifiers TID_1, TID_2 and TID_1 input from the reader 110. In the meantime, the tag identifiers TID_1, TID_2 and TID_1 are sequentially temporarily stored in the register 233.

Referring first to FIG. 5, taking a 4-bit counter array 501 as an example, the hash function module 231 first converts the tag identifier TID_1 through the three hash functions h0(x), h1(x) and h2(x) to generate first array addresses $h_0$, $h_1$ and $h_2$, and the first array addresses $h_0$, $h_1$ and $h_2$ respectively correspond to array elements A[1], A[4] and A[7] in the counter array 501. In this circumstance, when the cables 401 to 404 shift in the first shift direction DS1, the controller 234 determines that values in all of the array elements A[1], A[4] and A[7] are zero. Because the elements of the array include zero, the controller 234 transmits the tag identifier valid signal TValid to the data transmitting device 120 while controlling the register 233 to transmit the tag identifier TID_1 corresponding to the tag identifier valid signal TValid to the data transmitting device 120. In addition, the controller 234 controls the counter array 501 to increment the values in the array elements A[1], A[4] and A[7] by one. Then, after receiving the tag identifier valid signal TValid and the tag identifier TID_1, the data transmitting device 120 transmits cable sensing data related to the tag identifier TID_1 to the remote host.

Then, the hash function module 231 converts the tag identifier TID_2 through the hash functions h0(x), h1(x) and h2(x) to generate second array addresses $h_3$, $h_4$ and $h_5$, and the second array addresses $h_3$, $h_4$ and $h_5$ respectively correspond to array elements A[2], A[5] and A[7] in the counter array 501. The controller 234 determines that the values in the array elements A[2] and A[5] are zero, and the value in the element A[7] is not zero. Since the values of the elements of the array include zero, the controller 234 transmits the tag identifier valid signal TValid to the data transmitting device 120 while controlling the register 233 to transmit the tag identifier TID_2 corresponding to the tag identifier valid signal TValid to the data transmitting device 120. In addition, the controller 234 controls the counter array 501 to increment the values in the array elements A[2], A[5] and A[7] by one. Then, after receiving the tag identifier valid signal TValid and the tag identifier TID_2, the data transmitting device 120 transmits the cable sensing data related to the tag identifier TID_2 to the remote host.

In this circumstance, after the counter array 501 goes through the steps of determining the tag identifiers TID_1 and TID_2 by the chip 230, the values of the elements in the counter array 501 become those as illustrated in a counter array 502. If the reader 110 scans the tag identifier TID_1 again, the tag identifier TID_1 is converted through the hash functions h0(x), h1(x) and h2(x) to generate the first array addresses $h_0$, $h_1$ and $h_2$. The first array addresses $h_0$, $h_1$ and $h_2$ correspond to the values of the array elements A[1], A[4] and A[7] in the counter array 502 which do not include zero, and then, the controller 234 does not transmit the tag identifier valid signal TValid to the data transmitting device 120 nor controls the counter array 502 to increment the values in the array elements A[1], A[4] and A[7] by one. In this circumstance, the controller 234 controls the register 233 to transmit the tag identifier TID_1 corresponding to the tag identifier valid signal TValid to the data transmitting device 120. However, because the data transmitting device 120 does not receive the tag identifier valid signal TValid corresponding to the tag identifier TID_1, the data transmitting device 120 does not transmit the cable sensing data related to the tag identifier TID_1 to the remote host.

Referring to FIG. 6, in another embodiment, a counter array 601 shows values of array elements after the steps of determining the tag identifiers TID_1 and TID_2 by the chip 230. In this circumstance, the reader 110 reads the tag identifier TID_1, the tag identifier TID_1 is converted through the hash functions h0(x), h1(x) and h2(x) to generate the first array addresses $h_0$, $h_1$ and $h_2$, and first array addresses $h_0$, $h_1$ and $h_2$ respectively correspond to the array elements A[1], A[4] and A[7] in the counter array 601. When the cables 401 to 404 shift in the second shift direction DS2, the controller 234 determines that the values in the array elements A[1], A[4] and A[7] do not include zero, the controller 234 transmits the tag identifier valid signal TValid to the data transmitting device 120 while controlling the register 233 to transmit the tag identifier TID_1 corresponding to the tag identifier valid signal TValid to the data transmitting device 120. In addition, the controller 234 controls the counter array 601 to decrement the values in the array elements A[1], A[4] and A[7] by one. Then, after receiving the tag identifier valid signal TValid and the tag identifier TID_1, the data transmitting device 120 transmits the cable sensing data related to the tag identifier TID_1 to the remote host.

In this circumstance, after the counter array 601 goes though the steps of determining the tag identifier TID_1 by the chip 230, the values of the elements in the counter array 601 become those as illustrated in a counter array 602. If the reader 110 reads the tag identifier TID_1 again, the first array addresses $h_0$, $h_1$ and $h_2$ generated by converting the tag identifier TID_1 through the hash functions h0(x), h1(x) and h2(x) correspond to the values of the array elements A[1], A[4] and A[7] in the counter array 602 which include zero, and then, the controller 234 does not transmit the tag identifier valid signal TValid to the data transmitting device 120. Thus, the data transmitting device 120 does not transmit the cable sensing data related to the tag identifier TID_1 to the remote host.

Taking a 100-meter smart cable as an example, in case 5 sensors are embedded in the cable every 1 meter, then there are RFID tags of 500 sensors in total to be scanned. If a size of each counter array is 4 Kbyte (8192×4 bits) and 5 hash functions are used, an error rate is 0.0012. The method of cable sensing data collection provided by the invention may rapidly and effectively prevent the issue of repeatedly reading the same RFID tags by means of filtering out with the use of less sources and reduce the energy consumed in the wireless transmission of repeated data.

Based on the above, in the invention, the reader scans the RFID tags of the moving cables, the chip in the electronic apparatus can determine not to transmit the repeated cable sensing data to the remote host when the cable sensing data is repeatedly read by the reader within the reading range in a short time. In this way, it is possible to rapidly filter out a great amount of repeated measured data, so as to reduce the data amount transmitted between the electronic apparatus and the remote host, so as to reduce the energy consumed in transmitting the repeated data and reduce the occupation of the data storage space in the remote host.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of cable sensing data collection, applicable to an electronic apparatus having a counter array, wherein the electronic apparatus is configured to detect a cable comprising a plurality of sensors and a plurality of radio frequency identification (RFID) tags, wherein each of the RFID tags is configured to receive the cable sensing data of the cables obtained by the sensors, the method comprising:
   scanning each of the RFID tags to retrieve the cable sensing data, wherein the cable sensing data comprises a tag identifier of the RFID tag;
   converting the tag identifier into a plurality of array addresses through a plurality of hash functions; and
   determining whether to transmit the cable sensing data to a remote host according to whether or not a plurality of elements of the plurality of array addresses in the counter array comprise zero,
   when the cable shifts in a first shift direction, transmitting the cable sensing data to the remote host and incrementing the plurality of elements by one if the plurality of elements comprise zero, and not transmitting the cable sensing data to the remote host if the plurality of elements do not comprise zero.

2. The method of cable sensing data collection according to claim 1, wherein the step of determining whether to transmit the cable sensing data to the remote host according to whether or not the plurality of elements of the plurality of array addresses in the counter array comprise zero further comprises:
   when the cable shifts in a second shift direction, transmitting the cable sensing data to the remote host and decrementing the plurality of elements by one if the plurality of elements do not comprise zero, and not transmitting the cable sensing data to the remote host if the plurality of elements comprise zero.

3. The method of cable sensing data collection according to claim 2, wherein the first shift direction and the second shift direction are reverse directions.

4. An electronic apparatus, configured to detect a cable comprising a plurality of sensors and a plurality of radio frequency identification (RFID) tags, wherein each of the RFID tags is configured to receive cable sensing data of the cable obtained by the sensors, the electronic apparatus comprising:
- a reader, configured to scan each of the RFID tags to retrieve the cable sensing data, wherein the cable sensing data comprises a tag identifier of the RFID tag;
- a data transmitting device, configured to transmit the cable sensing data to a remote host; and
- a chip, coupled to the reader and the data transmitting device, wherein the chip comprises a counter array and is configured to:
- convert the tag identifier into a plurality of array addresses through a plurality of hash functions; and
- determine whether to transmit the cable sensing data to the remote host according to whether or not a plurality of elements of the plurality of array addresses in the counter array comprise zero,
- when the cable shifts in a first shift direction, control the data transmitting device to transmit the cable sensing data to the remote host and increment the plurality of elements by one if the plurality of elements comprise zero, and control the data transmitting device not to transmit the cable sensing data to the remote host if the plurality of elements do not comprise zero.

5. The electronic apparatus according to claim 4, wherein in the operation of determining whether to transmit the cable sensing data to the remote host according to whether or not the plurality of elements of the plurality of array addresses in the counter array comprise zero, the chip is configured to:
- when the cable shifts in a second shift direction, control the data transmitting device to transmit the cable sensing data to the remote host and decrement the plurality of elements by one if the plurality of elements do not comprise zero, and control the data transmitting device not to transmit the cable sensing data to the remote host if the plurality of elements comprise zero.

6. The electronic apparatus according to claim 5, wherein the first shift direction and the second shift direction are reverse directions.

7. A chip, applicable for an electronic apparatus configured to detect a cable comprising a plurality of sensors and a plurality of radio frequency identification (RFID) tags, wherein each of the RFID tags comprises a tag identifier, the chip comprising:
- a hash function module, comprising a plurality of hash functions, and configured to retrieve the tag identifier and convert the tag identifier into a plurality of array addresses through the plurality of hash functions;
- a counter array, coupled to the hash function module, and configured to receive the plurality of array addresses;
- a register, configured to receive and temporarily store the tag identifier; and a controller, coupled to the hash function module, the counter array and the register, and configured to:
receive a shift direction signal of the cable; and
determine whether to transmit a tag identifier valid signal corresponding to the tag identifier according to whether or not a plurality of elements of the plurality of array addresses in the counter array comprise zero,
when the shift direction signal indicates a first shift direction, transmit the tag identifier valid signal to a data transmitting device and increment the plurality of elements by one if the plurality of elements comprise zero, and not transmit the tag identifier valid signal to the data transmitting device if the plurality of elements do not comprise zero.

8. The chip according to claim 7, wherein the controller is further configured to:
when the shift direction signal indicates in a second shift direction, transmit the tag identifier valid signal to the data transmitting device and decrement the plurality of elements by one if the plurality of elements do not comprise zero, and not transmit the tag identifier valid signal to the data transmitting device if the plurality of elements comprise zero.

9. The chip according to claim 8, where the first shift direction and the second shift direction are reverse directions.

10. The chip according to claim 7, wherein the controller is configured to, while transmitting the tag identifier valid signal to the data transmitting device, control the register to transmit the tag identifier corresponding to the tag identifier valid signal to the data transmitting device.

* * * * *